United States Patent

Tsai et al.

[11] Patent Number: 6,110,817
[45] Date of Patent: Aug. 29, 2000

[54] METHOD FOR IMPROVEMENT OF ELECTROMIGRATION OF COPPER BY CARBON DOPING

[75] Inventors: Ming Wsing Tsai, Taipei; Shau-Lin Shue, Hsinchu, both of Taiwan

[73] Assignee: Taiwan Semiconductor Manufacturing Company, Hsin-Chu, Taiwan

[21] Appl. No.: 09/377,544

[22] Filed: Aug. 19, 1999

[51] Int. Cl.[7] .............................................. H01L 21/4763
[52] U.S. Cl. .................... 438/618; 438/584; 438/597; 438/687
[58] Field of Search .................... 438/618, 584, 438/597, 687

[56] References Cited

U.S. PATENT DOCUMENTS

| | | | |
|---|---|---|---|
| 4,950,615 | 8/1990 | Basol et al. | 437/5 |
| 5,674,787 | 10/1997 | Zhao et al. | |
| 5,681,779 | 10/1997 | Pasch et al. | 437/198 |
| 5,789,320 | 8/1998 | Andricacos et al. | 438/678 |
| 5,872,045 | 2/1999 | Lou et al. | |

Primary Examiner—Kevin M. Picardat
Assistant Examiner—D. M. Collins
Attorney, Agent, or Firm—Geoge O. Saile; Stephen B. Ackerman; Stephen G. Stanton

[57] ABSTRACT

A method for forming a carbon doped copper layer, preferably an electrochemically deposited carbon doped copper layer over a semiconductor structure, comprising the following steps. A semiconductor structure having an upper surface is provided. The semiconductor structure is placed in an electrochemical bath having a predetermined concentration of carbon. A first carbon doped copper layer is electrochemically deposited for a first period of time at a first current density. The first carbon doped copper layer blanket fills the semiconductor structure and has a predetermined thickness and a first concentration of carbon. A second carbon doped copper layer is electrochemically deposited over the first carbon doped copper layer for a second period of time at a second current density. The second carbon doped copper layer has a predetermined thickness and a second concentration of carbon. The carbon doped copper layer formed by the process of the present invention has improved electromigration without causing high resistivity.

22 Claims, 2 Drawing Sheets

METHOD FOR IMPROVEMENT OF ELECTROMIGRATION OF COPPER BY CARBON DOPING

FIELD OF THE INVENTION

The present invention relates generally to methods for reducing electromigration of copper layers in integrated circuits and specifically for doped copper layers.

BACKGROUND OF THE INVENTION

Fabrication of integrated circuits frequently require selectively deposition of metal layers upon semiconductors. One of the problems associated with such metal layers is the tendency of electromigration of the metal, which may adversely affect the integrity of semiconductor devices incorporation the metal layers, particularly where the metal layers form part of an integrated circuit. Copper (Cu) is one of the promising metals used for such metal layers for next generation ultra-large scale integration (ULSI) metallization due to Cu's low resistivity and relatively high electomigration resistance.

It has been reported that the copper electomigration can be improved by alloying Cu with, for example, zirconium (Zr) or tin (Sn). It has been reported that copper doped with zirconium or tin has one order of electromigration life time. "One order of electromigration life time" means that CuZr and CuSn alloys have a electromigration reduction that is a power of ten (10) times better than non-doped copper. This is because the Zr or Sn doping material segregates in the grain boundary and reduces the grain boundary diffusion. However, the conventional doping process for CuZr or CuSn alloys involve sputtering a Zr or Sn metal over Cu, or co-sputtering. For the most extensively used electrochemical deposition of Cu, such sputtering is not easy to apply. Also, doping copper with titanium (Ti), aluminum (Al), Zr or Sn increases the resistivity of Cu from 1.7 $\mu$ohms-cm to between about 3 to 5 $\mu$ohms-cm. In order to reduce this increased resistivity to about 2.3 $\mu$ohms-cm, a subsequent high temperature annealing step (around 500° C.) is necessary. However such a high temperature annealing is not allowed in the Cu backend process as it may degrade the doped layer(s) and any aluminum (Al) layers.

U.S. Pat. No. 5,789,320 to Andricacos et al. describes plating of noble metal electrodes for DRAM and FRAM. Noble metals are plated on a preexisting seed layer and may be spatially selective or non selective. A diamond-like carbon mask can be used in the plating process. A self-aligned process is also described for selectively coating insulators in a through-mask process.

U.S. Pat. No. 4,950,615 to Basol et al. describes a technique for forming thin films of Group IIB metal (zinc (Zn), cadmium (Cd) or mercury(Hg))—telluride (Te), such as $Cd_xZn_{1-x}Te$ ($0 \leq x \leq 1$) on a substrate. A technique is also described for doping this material by chemically forming a thin layer of a dopant on the surface of the unreacted elements and then heating the elements along with the layer of dopant, as well as a method of fabricating a thin film photovoltaic cell.

U.S. Pat. No. 5,681,779 to Pasch et al. describes a method of doping metal layers on integrated circuits to provide electromigration resistance and integrated circuits having metal alloy interconnects characterized by being resistant to electromigration. Copper doped aluminum is preferred although tungsten (W) doped copper is also disclosed. The dopant is applied subsequent to patterning and etching of the integrated circuit structure and the structure is then heated at a temperature (preferably 350° C. to 450° C.) sufficient to uniformly diffuse the second metal dopant through the bulk of the patterned, first conductive metal film.

SUMMARY OF THE INVENTION

Accordingly, it is an object of the present invention to reduce the electromigration of doped copper layers in integrated circuits.

Another object of the present invention is to form a doped copper layer in integrated circuits by doping carbon into the copper during electrochemical deposition.

A further object of the present invention is to form a doped copper layer in a integrated circuit having reduced electromigration and a resistivity similar to that of undoped copper.

Other objects and advantages of the present invention will become apparent from the following detailed description thereof, which includes the best mode contemplated for practicing the invention.

It has now been discovered that the above and other objects of the present invention may be accomplished in the following manner. Specifically, a semiconductor structure having an upper surface, and, preferably, a trench formed in the semiconductor structure, is provided. The semiconductor structure is placed in an electrochemical bath having a predetermined concentration of carbon dopant. A first carbon doped copper layer is electrochemically deposited for a first period of time and at a first current density. The first carbon doped copper layer blanket fills the semiconductor structure (and fills the trench) and has a predetermined thickness and a first concentration of carbon. A second carbon doped copper layer is electrochemically deposited over the first carbon doped copper layer for a second period of time and at a second current density. The second carbon doped copper layer has a predetermined thickness and a second concentration of carbon. A barrier layer, preferably comprised of tantalum nitride (TaN), may be first deposited over the upper surface of the semiconductor structure and lining the trench, with a copper seed layer deposited over the barrier layer before electrochemical deposition of the first carbon doped copper layer. The carbon doped copper layer formed by the process of the present invention has improved electromigration without causing high resistivity.

BRIEF DESCRIPTION OF THE DRAWINGS

The features and advantages of the method according to the present invention and further details of that method in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

Figure 1:
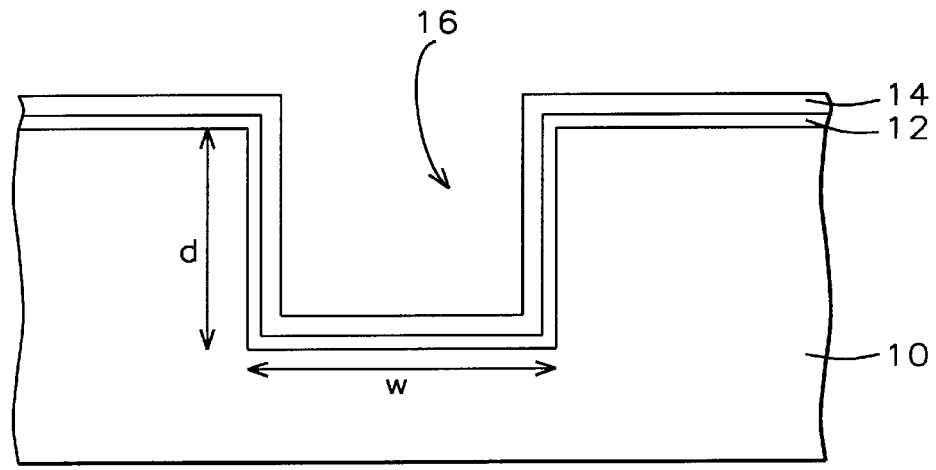
FIGS. 1 and 2 show schematic cross-sectional diagrams illustrating the results of progressive stages in electroplating carbon doped copper in a trench employed in integrated circuit fabrication, in accordance with a preferred embodiment of the method of the present invention.
Figure 2:
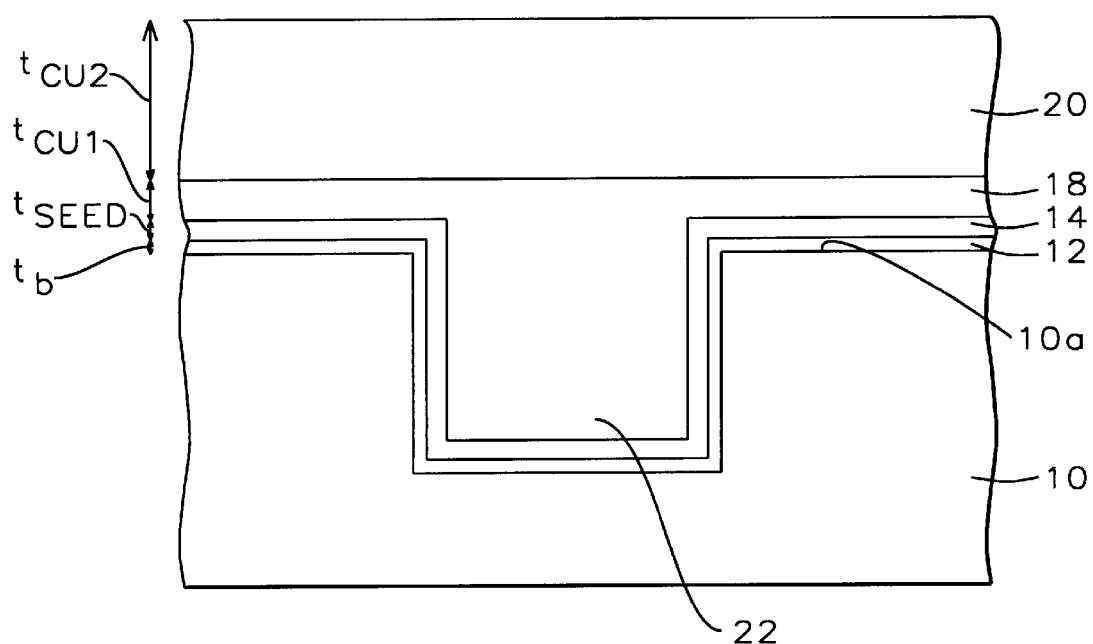

Accordingly, as shown in FIG. 1, a semiconductor structure 10 has upper surface 10a and trench 16 that may be formed therein by various conventional methods and equipment well known in the art. Trench 16 has a depth, d, from about 3000 to 20,000 Å and more preferably 8000 Å; a width, w, preferably of from about 1000 to 6600 Å and more preferably 2600 Å; and an aspect ratio from about 0.01 to 10 and more preferably 3.

It is noted that trenches 16 may be holes, vias or any other like structure, and various layers, not shown, may comprise semiconductor structure 10. These various layers may include lower levels of metallization, gate electrodes, isolation regions, capacitors or other features. The structure surface, i.e. the uppermost exposed layer over semiconductor structure 10, may be an overlying interlevel metal dielectric (IMD) layer. The subsequently formed plug 22 may contact an underlying conductive structure (not shown) such as a metal or polysilicon line.

The trenched semiconductor structure 10 is prepared for copper electroplating (electrochemical deposition (ECD)) which may include the addition of a diffusion barrier layer, an adhesion layer, and/or a metallization layer generally shown as layer 12 over semiconductor structure 10, blanket filling semiconductor structure surface 10a and lining trench 16. Layer 12 has a thickness, $t_b$, from about 50 to 500 Å and more preferably 200 Å. Layer 12 may, for example, consist of a thin conductive barrier layer such as titanium nitride, titanium—tungsten, nitrided titanium—tungsten or, preferably, tantalum nitride (TaN) blanket deposited by one of several techniques including sputtering or low pressure chemical vapor deposition (LPCVD).

A copper seed layer 14, having a thickness, $t_{seed}$, from about 300 to 3000 Å, and more preferably 1500 Å, may then be deposited by physical vapor deposition (PVD), for example, on barrier layer 12.

Figure 3:
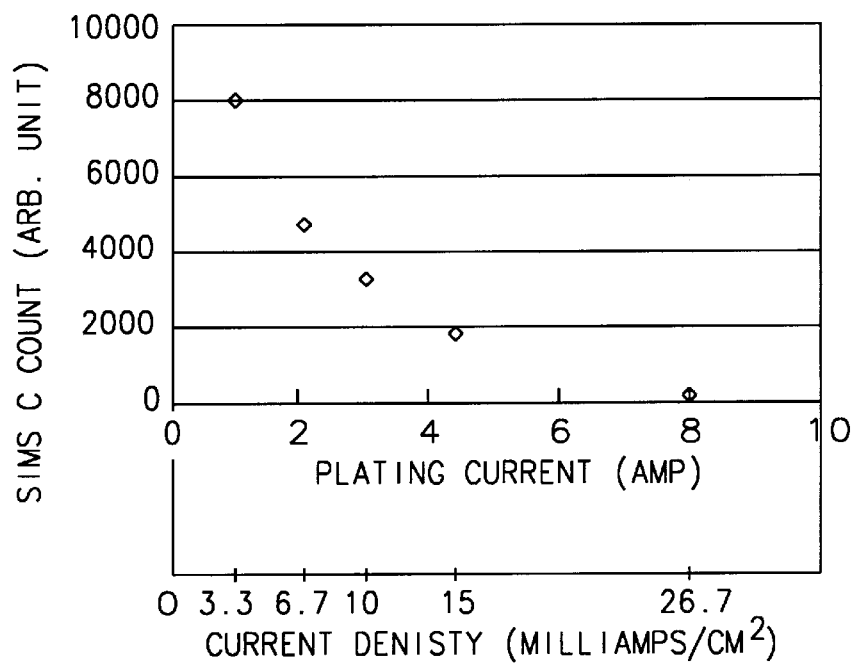
FIG. 3 is a graph of carbon count (arbitrary units) versus both the electroplating current and the electroplating current density.

As shown in FIG. 3, increasing the plating current and hence the current density, decreases the concentration of carbon (C) in the electroplated copper layer. If low current will reduce throughput, then a lower plating current is initially used to form first electroplated carbon doped copper layer 18.

Semiconductor structure 10 is placed into an electroplating solution that includes a predetermined concentration of carbon (C) from the additives in the ECD bath. In a first step, copper is electroplated (ECD) onto semiconductor structure 10 filling trench 16 and blanketing the semiconductor structure surface to form a first carbon doped copper electroplated layer 18 under the following electroplating parameters (for an eight (8) inch wafer):

carbon (C) concentration from about 0.01 wt. % to 3 wt. % and more preferably from about 0.1 wt. % to 1 wt. %;

a pH from about 0.1 to about 4 and more preferably 1;

a current density from about 1 mA/cm$^2$ to about 30 mA/cm$^2$ and more preferably from about 1 mA/cm$^2$ to about 5 mA/cm$^2$;

a temperature from about 20 to about 50° C. and more preferably 25 degrees C; and time of electroplating: from about 5 to 300 seconds and more preferably from about 10 seconds to 120 seconds.

First carbon doped copper layer 18 has a thickness, $t_{Cu1}$, from about 550 to 4000 Å and more preferably from about 300 to 700 Å and has a concentration of carbon from about 0.1 wt. % to 3 wt. % and more preferably 0.1 wt. % to 1 wt. %.

In a second step, the current density in the electroplating solution is then increased to about 10 to 35 milliamps/cm$^2$ and more preferably from about 20 to 25 milliamps/cm$^2$ thus decreasing the concentration of carbon in the second carbon doped copper electroplated layer 20 (see FIG. 3), and copper is then electroplated onto first carbon doped copper layer 18, blanketing the first carbon doped copper layer 18 to form a second carbon doped copper electroplated layer 20 under the following electroplating parameters (for an eight (8) inch wafer) (unless otherwise noted the other parameters remain the same):

carbon (C) concentration from about 0.01 wt. % to 3 wt. % and more preferably from about 0.1 wt. % to 1 wt. %;

a pH from about 0.1 to about 4 and more preferably 1;

a current density from about 10 mA/cm$^2$ to about 35 mA/cm$^2$ and more preferably from about 20 mA/cm$^2$ to about 25 mA/cm$^2$;

a temperature from about 20 to about 50° C. and more preferably 25 degrees C; and time of electroplating: from about 30 seconds to 400 seconds and more preferably from about 120 seconds to 290 seconds.

The current density for the second carbon doped copper layer electroplating is from about 2 to 10 times greater than the current density for the first carbon doped copper layer electroplating and more preferably is 4 to 6 times greater. This is not to limit the invention, but are the ranges that have been found to work with the present technology.

Second carbon doped copper layer 20 has a thickness, $t_{Cu2}$, from about 2000 to 15,000 Å and more preferably from 4000 to 6,000 Å. Second carbon doped copper layer 20 has a concentration of carbon from about 0.01 wt. % to 1 wt. % and more preferably 0.01 wt. % to 0.1 wt. % and is less than the carbon concentration in first carbon doped copper layer 18.

Second carbon doped copper layer 20 may then be planarized, preferably by chemical-mechanical polishing (CMP), to form a planarized (not shown) copper filled trench or via, e.g. plug 22.

The carbon doped copper layers formed in accordance with the present invention have improved electromigration properties without having a high resistivity because carbon segregates into the copper grain boundary, and the carbon is simultaneously doped into copper layers 18, 20 during electroplating. Thus the need for additional steps to reduce the otherwise increased resistivity in, for example, Sn or Zr doped copper, is eliminated. Such additional steps have included annealing which is unacceptable for use in the copper backend process.

Figure 4:
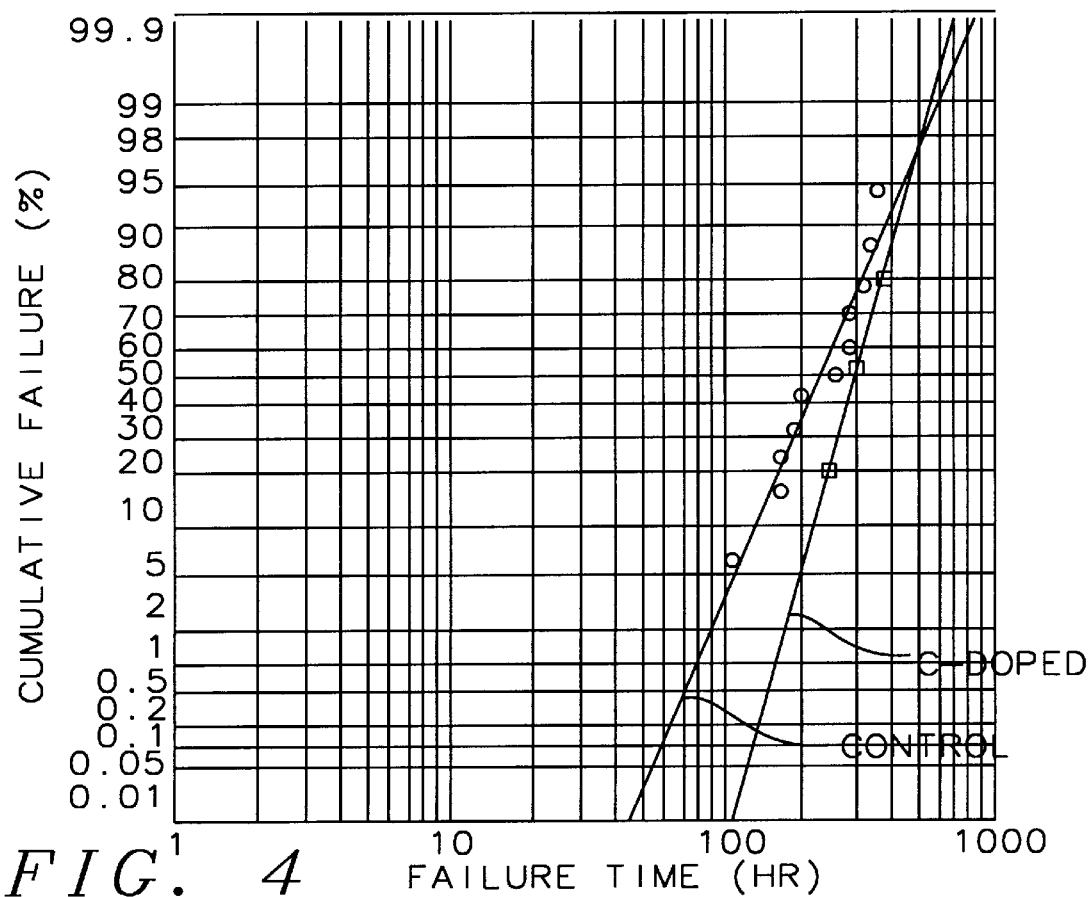
FIG. 4 is a lognormal graph of the percentage of cumulative failure versus failure time in hours for a control copper plated layer and a carbon doped electroplated layer made in accordance with a preferred embodiment of the method of the present invention.

FIG. 4 is a lognormal (base 10) graph plotting the percentage cumulative failure rate versus failure time (in hours) for electroplated copper layers formed by a previous method ("Control") and electroplated carbon doped copper layers formed in accordance with the present invention ("C-doped"). As demonstrated in FIG. 4, the C-doped structures made in accordance with the present invention last consistently longer before failure for the same cumulative failure percentage versus previous electroplated, non-carbon doped copper layers. Please see tables I (used to predict metal) and II (for electromigration) below:

TABLE I

| | CONTROL Cu LAYER | INVENTION'S C-DOPED Cu LAYER |
|---|---|---|
| Ea | 0.8 | 0.8 |
| T (stress) | 225 | 225 |
| Life (hours) | 100,000 | 100,000 |
| J (stress) | 28 | 28 |

TABLE II

| | For Electromigration | |
|---|---|---|
| | CONTROL | C-DOPE |
| sigma (standard deviation) | 0.43779218 | 0.275793501 |
| $\mu$ (mean) | 5.406638249 | 5.679800064 |
| 0.1% L.T. (cumulative failure) | 57.61329042 | 124.902153 |
| Jmax (max. current for metal to carry) | 11.0282005 | 16.23784067 |

While particular embodiments of the present invention have been illustrated and described, it is not intended to limit the invention, except as defined by the following claims.

We claim:

1. A method for forming a carbon doped copper layer, the steps comprising:

providing a semiconductor structure having an upper surface;

placing said semiconductor structure in an electrochemical bath having a predetermined concentration of carbon;

electrochemically depositing a first carbon doped copper layer for a first period of time at a first current density; said first carbon doped copper layer having a predetermined thickness and a first concentration of carbon; said first carbon doped copper layer blanket filling said semiconductor structure upper surface; and electrochemically depositing over said first carbon doped copper layer a second carbon doped copper layer for a second period of time at a second current density; said second carbon doped copper layer having a predetermined thickness and a second concentration of carbon.

2. The method of claim 1, wherein said first concentration of carbon in said first carbon doped copper layer is higher than said second concentration of carbon in said second carbon doped copper layer.

3. The method of claim 1, wherein said first current density is lower than said second current density.

4. The method of claim 1, wherein said predetermined concentration of carbon in said electrochemical bath is inversely proportional to said first and second current densities.

5. The method of claim 1, wherein said first period of time is from about 5 seconds to 300 seconds, and said second period of time is from about 30 seconds to 400 seconds.

6. The method of claim 1, wherein said first period of time is from about 10 seconds to 120 seconds, and said second period of time is from about 120 seconds to 290 seconds.

7. The method of claim 1, wherein said predetermined thickness of said first carbon doped copper layer is from about 550 to 4000 Å and said predetermined thickness of said second carbon doped copper layer is from about 2000 to 15,000 Å.

8. The method of claim 1, wherein said first current density is from about 1 to 30 milliamps/cm$^2$ and said first concentration of carbon in said first carbon doped copper layer is from about 0.1 wt. % to 3 wt. %, and said second current density is from about 10 to 35 milliamps/cm$^2$ and said second concentration of carbon in said second carbon doped copper layer is from about 0.01 wt. % to 1 wt. %.

9. The method of claim 1, wherein the ratio of said second current density to said first current density is from about 2 to 10.

10. The method of claim 1, wherein the ratio of said second current density to said first current density is from about 4 to 6.

11. The method of claim 1 further including the step of planarizing said second carbon doped copper layer.

12. A method for forming a carbon doped copper layer in a trench, the steps comprising:

providing a semiconductor structure and a trench formed therein; said semiconductor structure having an upper surface;

placing said semiconductor structure in an electrochemical bath having a predetermined concentration of carbon;

electrochemically depositing a first carbon doped copper layer for a first period of time at a first current density; said first carbon doped copper layer having a predetermined thickness and a first concentration of carbon; said first carbon doped copper layer blanket filling said semiconductor structure upper surface; and electrochemically depositing over said first carbon doped copper layer a second carbon doped copper layer for a second period of time at a second current density; said second carbon doped copper layer having a predetermined thickness and a second concentration of carbon.

13. The method of claim 12, wherein said first concentration of carbon in said first carbon doped copper layer is higher than said second concentration of carbon in said second carbon doped copper layer.

14. The method of claim 12, wherein said first current density is lower than said second current density.

15. The method of claim 12, wherein said trenched semiconductor structure includes a barrier layer lining said semiconductor structure upper surface and said within said trench; said barrier layer being selected from the group tantalum nitride, titanium nitride, titanium—tungsten, and nitrided—titanium—tungsten.

16. The method of claim 12, wherein said first period of time is from about 5 seconds to 300 seconds, and said second period of time is from about 30 seconds to 400 seconds.

17. The method of claim 12, wherein said first period of time is from about 10 seconds to 120 seconds, and said second period of time is from about 120 seconds to 290 seconds.

18. The method of claim 12, wherein said predetermined thickness of said first carbon doped copper layer is from about 300 to 700 Å and said predetermined thickness of said second carbon doped copper layer is from about 4000 to 6000 Å.

19. The method of claim 12, wherein said first current density is from about 1 to 5 milliamps/cm$^2$ and said first concentration of carbon in said first carbon doped copper layer is from about 0.1 wt. % to 1 wt. %, and said second current density is from about 20 to 25 milliamps/cm$^2$ and said second concentration of carbon in said second carbon doped copper layer is from about 0.01 wt. % to 0.1 wt. %.

20. The method of claim 12, wherein the ratio of said second current density to said first current density is from about 2 to 10.

21. The method of claim 12, wherein the ratio of said second current density to said first current density is from about 4 to 6.

22. The method of claim 12 further including the step of planarizing said second carbon doped copper layer to form a planarized copper filled trench.

* * * * *